United States Patent [19]
Tuttle

[11] Patent Number: 5,633,122
[45] Date of Patent: May 27, 1997

[54] TEST FIXTURE AND METHOD FOR PRODUCING A TEST FIXTURE FOR TESTING UNPACKAGED SEMICONDUCTOR DIE

[75] Inventor: Mark E. Tuttle, Boise, Id.

[73] Assignee: Micron Technology, Inc., Boise, Id.

[21] Appl. No.: 400,217

[22] Filed: Mar. 7, 1995

Related U.S. Application Data

[60] Continuation-in-part of Ser. No. 271,434, Jul. 7, 1994, abandoned, which is a division of Ser. No. 107,212, Aug. 16, 1993, abandoned.

[51] Int. Cl.⁶ .................................................. G01R 31/26
[52] U.S. Cl. ........................ 430/317; 430/311; 324/765; 438/17
[58] Field of Search ........................ 430/311, 313, 430/317, 329, 318, 30; 216/17; 324/765; 437/8

[56] References Cited

U.S. PATENT DOCUMENTS

| | | | |
|---|---|---|---|
| 4,899,107 | 2/1990 | Corbett et al. | 324/158 |
| 5,034,091 | 7/1991 | Trask et al. | 156/643 |
| 5,046,239 | 9/1991 | Miller et al. | 216/17 |
| 5,073,117 | 12/1991 | Malhi | 439/71 |
| 5,088,190 | 2/1992 | Malhi et al. | 29/843 |
| 5,123,850 | 6/1992 | Elder et al. | 439/67 |
| 5,200,694 | 4/1993 | Nesbitt et al. | 324/158 F |
| 5,206,585 | 4/1993 | Chang et al. | 324/158 P |
| 5,236,551 | 8/1993 | Pan | 156/643 |
| 5,302,891 | 4/1994 | Wood et al. | 324/158 |
| 5,326,428 | 7/1994 | Farnworth et al. | 156/654 |
| 5,367,253 | 11/1994 | Wood et al. | 324/158 |
| 5,424,652 | 6/1995 | Hembree et al. | 324/765 |
| 5,440,240 | 8/1995 | Wood | 324/765 |
| 5,483,174 | 1/1996 | Hembree | 324/765 |
| 5,495,179 | 2/1996 | Wood et al. | 324/755 |
| 5,519,332 | 5/1996 | Wood et al. | 324/755 |
| 5,530,376 | 6/1996 | Lim et al. | 324/765 |
| 5,541,525 | 7/1996 | Wood et al. | 324/755 |
| 5,543,725 | 8/1996 | Lim et al. | 324/755 |
| 5,581,195 | 12/1996 | Lee et al. | 324/755 |

FOREIGN PATENT DOCUMENTS 3-146884  6/1991  Japan.

*Primary Examiner*—John A. McPherson
*Attorney, Agent, or Firm*—Stephen A. Gratton

[57] ABSTRACT

An improved test fixture for testing unpackaged semiconductor die and a method for forming the test fixture are provided. The test fixture includes a base formed of a material such as silicon. The base includes a pattern of contact pads corresponding to a pattern of contact locations on the die (e.g., bumped bond pads). The contact pads are connectable via external contacts to external test circuitry. In addition, the test fixture includes an alignment member adapted to align the die on the base. The alignment member includes an alignment opening adapted to cradle the die and form a fluid tight seal. During a test procedure an enclosed cavity is formed between the die held in the alignment opening and the base. The alignment opening is in fluid communication with a vacuum source. Upon application of a vacuum to the cavity, a force is exerted on the die. This places the contact locations on the die in temporary electrical contact with the contact pads on the base.

30 Claims, 3 Drawing Sheets

TEST FIXTURE AND METHOD FOR PRODUCING A TEST FIXTURE FOR TESTING UNPACKAGED SEMICONDUCTOR DIE

CROSS REFERENCE TO RELATED APPLICATIONS

This application is a continuation-in-part of application Ser. No. 08/271,434 filed Jul. 7, 1994, now abandoned, which is a division of application Ser. No. 08/107,212 filed Aug. 16, 1993, now abandoned.

FIELD OF THE INVENTION

This invention relates to semiconductor manufacture and more particularly to an improved test fixture for testing discrete, unpackaged semiconductor die and to an improved method for forming such a test fixture.

BACKGROUND OF THE INVENTION

Microelectronic packages called hybrids, or multi chip modules, utilize unpackaged semiconductor die. Because of an increased use of hybrids, semiconductor manufacturers are required to supply unpackaged die that have been tested and certified as known good die (KGD). Known good die is a collective term that denotes unpackaged die having the same reliability as the equivalent packaged die.

The need for known good die has led to the development of test apparatus suitable for testing discrete, unpackaged semiconductor die. As an example, test apparatus for conducting burn-in tests for discrete die are disclosed in U.S. Pat. No. 4,899,107 to Corbett et al. and U.S. Pat. No. 5,302,891 to Wood et al., which are assigned to Micron Technology, Inc. Other test apparatus for unpackaged die are disclosed in U.S. Pat. No. 5,123,850 to Elder et al., and U.S. Pat. No. 5,073,117 to Malhi et al., which are assigned to Texas Instruments.

With this type of test apparatus, a non-permanent electrical connection must be made between contact locations on the die, such as bond pads, and external test circuitry associated with the test apparatus. The bond pads provide a connection point for testing the integrated circuitry formed on the die. The test apparatus typically includes some type of interconnect for effecting a temporary electrical connection to the bond pads on the die.

In making this temporary electrical connection, it is desirable to effect a connection that causes as little damage as possible to the bond pad. If the temporary connection to a bond pad damages the pad, the entire die may be rendered as unusable. This is difficult to accomplish because the connection must also produce a low resistance or ohmic contact with the bond pad.

Another important consideration in testing of known good die is the alignment of the contact locations on the die with the corresponding contact structure on the test apparatus. In assembling the die with the test apparatus it is desirable to quickly and efficiently align the contact locations on the die and corresponding contact structures on the test apparatus.

OBJECTION OF THE INVENTION

In view of the need in the art for improved test apparatus for testing unpackaged semiconductor die, it is an object of the present invention to provide an improved test fixture for testing unpackaged semiconductor die.

It is a further object of the present invention to provide an improved method for forming a test fixture for testing unpackaged semiconductor die.

It is a further object of the present invention to provide an improved test fixture and method for fabricating such a test fixture characterized by an improved alignment structure for aligning contact locations on a discrete unpackaged die with corresponding contact pads formed on the test fixture.

Other objects, advantages and capabilities of the present invention will become more apparent as the description proceeds.

SUMMARY OF THE INVENTION

In accordance with the present invention, an improved test fixture for testing an unpackaged semiconductor die and a method for forming the test fixture are provided. The test fixture includes a base having contact pads corresponding to contact locations (e.g., bumped bond pads) on the die. The contact pads on the test fixture are connected to external contacts which are connectable to external test circuitry. The test fixture also includes an alignment member formed on the base and having an alignment opening adapted to align the die. Specifically, the alignment opening aligns the contact locations on the die with the contact pads on the test fixture base. The test fixture also includes a vacuum conduit placed through the base and connectable to a vacuum source. Upon application of a vacuum, a reduced pressure cavity is formed between the die and the base of the test fixture and the contact locations on the die are pressed into temporary electrical contact with the contact pads on the test fixture.

The alignment member can be formed as a separate component that is secured to the test fixture base using insulating adhesives. In this case an alignment pattern can be formed on the base by screen printing or other deposition process. Alternately in place of a separately formed alignment member, the base and alignment member for the test fixture can be formed as a unitary multi layered structure using semiconductor fabrication techniques. A preferred material for forming the alignment layer is polyimide which can be deposited to a desired thickness and patterned using a layer of photoresist. The polyimide and photoresist can then be developed simultaneously using a suitable wet developer such as tetramethylammonium hydroxide (TMAH).

A method for forming the test fixture with an alignment layer includes the broad steps of: forming a substrate; forming contact pads on the substrate by depositing and patterning a metal layer; forming the alignment layer on the substrate; patterning the alignment layer using a layer of photoresist; developing the photoresist and alignment layer simultaneously to form an alignment opening; stripping the photoresist; curing the alignment layer; and then forming a conduit through the substrate to the alignment opening.

DETAILED DESCRIPTION OF THE PREFERRED EMBODIMENTS

Figure 1:
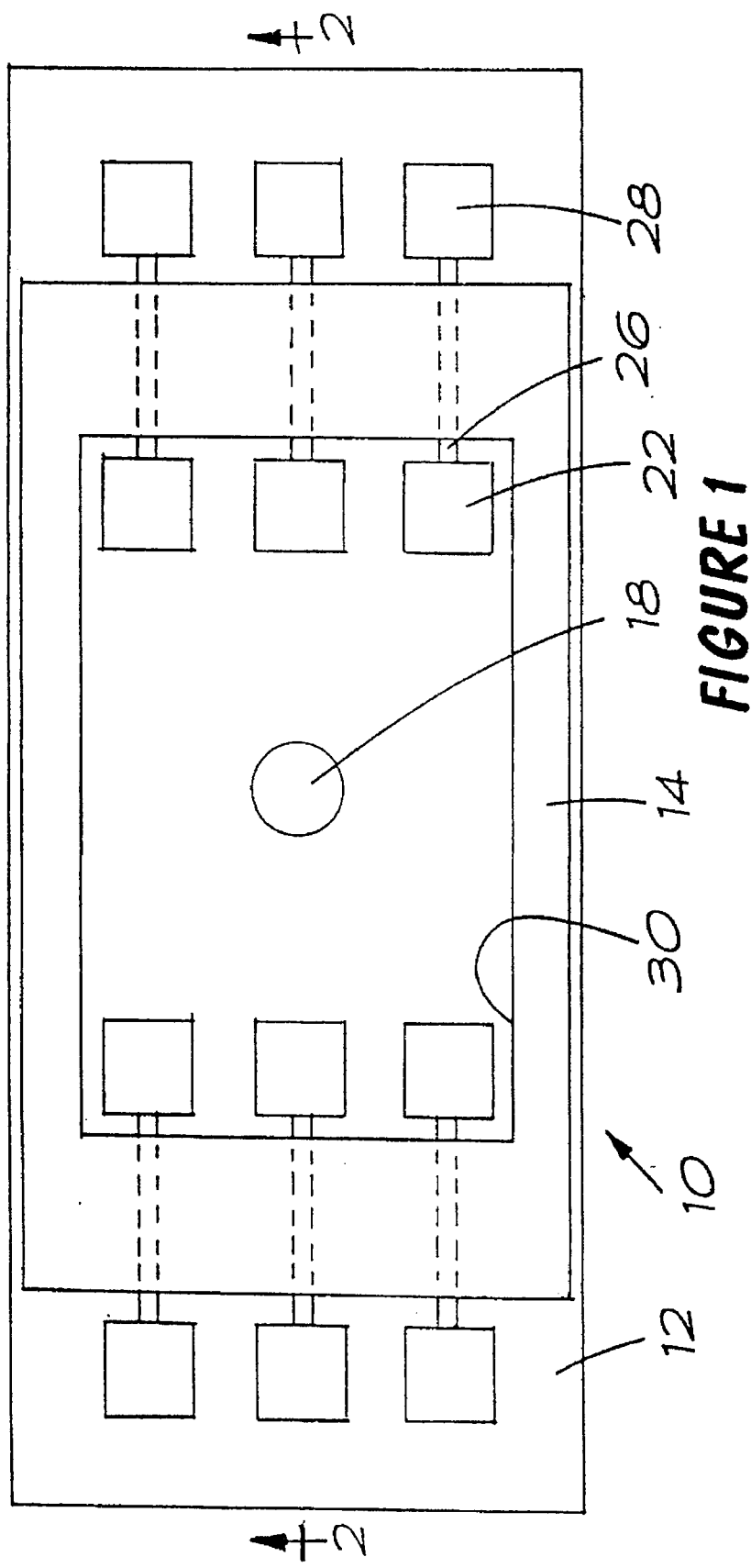
FIG. 1 is an enlarged plan view of a test fixture constructed in accordance with the invention with an alignment member formed as a separate component and attached to a base.
Figure 2:
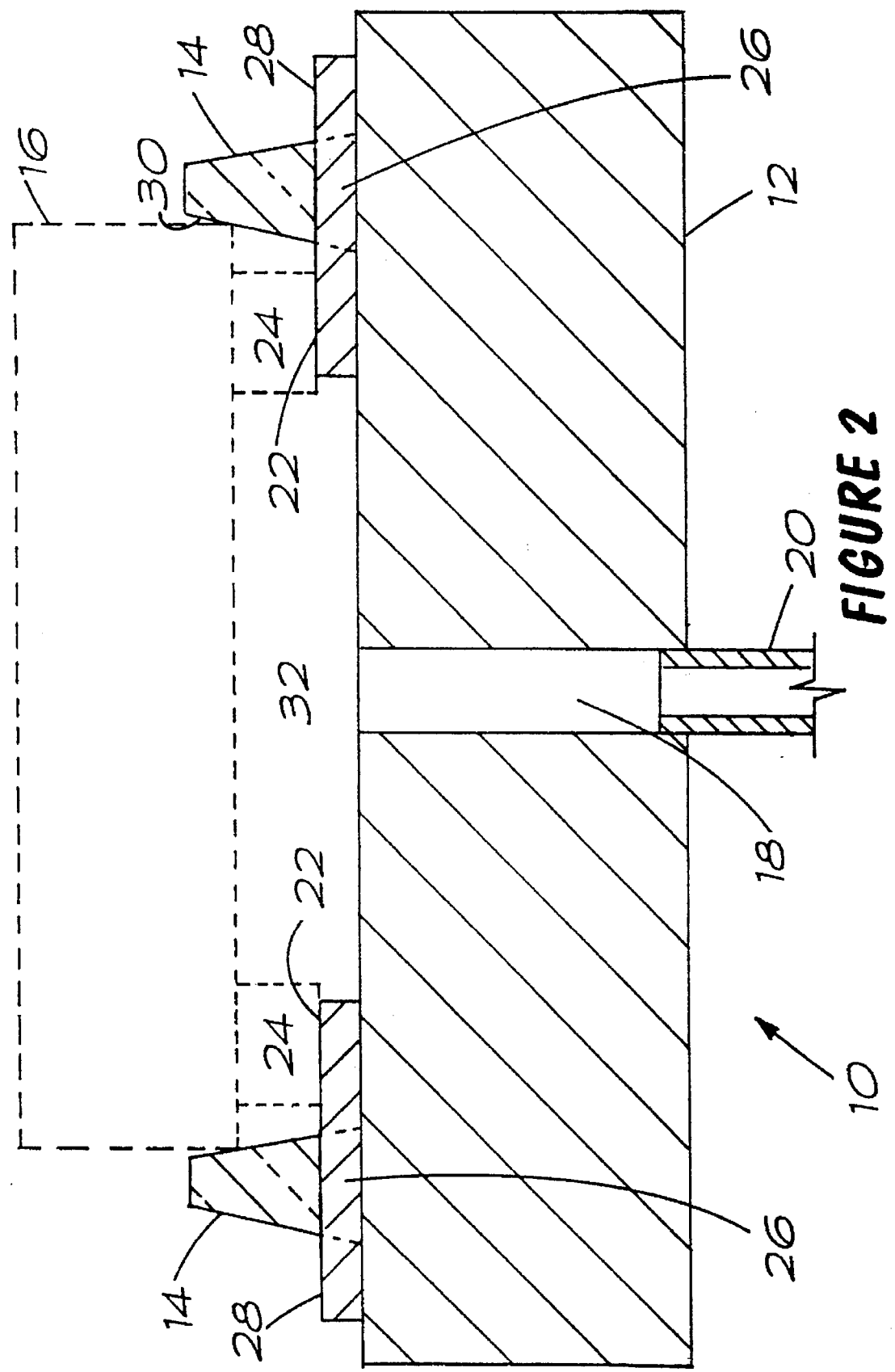
FIG. 2 is an enlarged cross sectional view of the test fixture taken along section line 2—2 of FIG. 1.

With reference to FIGS. 1 and 2, a test fixture 10 constructed in accordance with the invention is shown. The test fixture 10 includes a base 12 and an alignment member 14 attached to the base 12. In the embodiment illustrated in FIGS. 1 and 2, the alignment member 14 is formed as a separate component and then attached to the base 12.

The base 12 is adapted to provide a temporary electrical connection to a semiconductor die 16 (i.e., die under test). The base 12 is formed of a material having a coefficient of thermal expansion that closely matches that of the semiconductor die 16. Insulating materials such as a ceramic or printed circuit board material are preferred. Other suitable materials include monocrystalline silicon, silicon-on-glass, silicon-on-sapphire, or germanium. Preferably a large number of bases 12 are formed on a single substrate or wafer using fabrication techniques used in semiconductor manufacture. The substrate can then be diced (e.g., saw cut) along streets or scribe lines to singulate the bases 12.

The base 12 has a generally rectangular outer peripheral configuration. In addition, the base 12 has one or more vacuum holes 18 adapted for connection to a vacuum conduit 20 (FIG. 2).

A pattern of contact pads 22 are formed on the base 12. The contact pads 22 are formed with a size and spacing that corresponds to a size and spacing of bond pads 24 on the semiconductor die 16. The bond pads 24 on the die 16 connect to integrated circuitry formed in the die 16. The die 16 illustrated in FIG. 2 is a bumped die having bond pads 24 formed with a bump of solderable material. This type of bumped bond pad 24 is frequently used for flip chip bonding the die 16 to a printed circuit board or other substrate. These bumped bond pads 24 have a width of about 50 µm to 100 µm.

The contact pads 22 on the base 12 are adapted to contact the bond pads 24 on the die 16 to establish a temporary electrical connection. The contact pads 22 are in electrical communication with circuit traces 26 formed on the base 12. The circuit traces 26 in turn are in electrical communication with external contacts 28. The external contacts 28 are connectable to external test circuitry. By way of example, this electrical connection can be made by wire bonding or using a mechanical connection such as a clip or socket.

The contact pads 22, circuit traces 26 and external contacts 28 can be formed of one or more conductive materials using a suitable metallization process. As an example, the contact pads 22, circuit traces 26 and external contacts 28 can be formed of a highly conductive metal, such as aluminum (AL), iridium (Ir), copper (Cu), titanium (Ti), tungsten (W), tantalum (Ta), molybdenum (Mo) or alloys of these metals. A suitable metallization process can include the steps of deposition (e.g., sputter, CVD), patterning (e.g., photopatterning) and etching (e.g., wet or dry etch).

The alignment member 14 is adapted to cradle the die 16, substantially as shown in FIG. 2, and align the bond pads 24 on the die 16 with the contact pads 22 on the base 12. The alignment member 14 is formed of a temperature resistant material such as ceramic or high temperature plastic. The alignment member 14 can be machined, molded or otherwise formed separately from the base 12 and then attached to the base 12 using a suitable insulating adhesive (not shown).

As shown in FIG. 1, the alignment member 14, viewed from above, has a rectangular shaped outer periphery. In addition, the alignment member 14 has a rectangular shaped alignment opening 30 sized to engage the rectangular edge of a rectangular semiconductor die 16. As shown in FIG. 2, the sidewalls 32 of the alignment opening 30 are sloped to provide a guide function. As also shown in FIG. 2, the die 16 nests within the alignment opening 30 and forms an enclosed cavity 32. As will be more fully explained, during a testing procedure using the test fixture 10, the cavity 32 is evacuated. This forces the die 16 against the alignment member 14 and the bond pads 24 of the die 16 into contact with the contact pads 22 on the base 12.

During fabrication of the test fixture 10, in order to properly position the alignment member 14 on the base 12 for permanent attachment, a guide material (not shown) can be formed on the base 12. As an example, a polymer material, such as polyimide, can be screen printed onto the surface of the base 12. Such a screen printed layer of material can form a pattern of features for accurately positioning the alignment member 14 on the base 12. Alternately the alignment member 14 can be mounted on the base 12 using other alignment techniques such as alignment fiducials and optical alignment.

During use of the test fixture 10, the die 16 is placed on the alignment opening 30 of the alignment member 14. The sloped sidewalls 32 of the alignment opening 30 cradle and guide the die 16, such that lateral movement is minimized. In addition, the alignment opening 30 positions the die 16 so that the bond pads 24 on the die 16 align with the contact pads 22 on the base 12. Furthermore, the outer peripheral edge of the die 16 forms a seal with the sidewalls 32 of the alignment opening 30. When a vacuum is applied through the vacuum hole 18 of the base 12, the cavity 32 is evacuated and a force is exerted on the die 16. This pulls the die 16 downward so that the bond pads 24 on the die 16 positively engage the contact pads 22 on the base 12 to form a temporary electrical connection. By controlling the size, shape, number and location of the vacuum hole 18 and by controlling the vacuum pressure, the contact force between the bond pads 24 on the die 16 and contact pads 22 on the test fixture 10 can be reliably and reproducibly controlled. At the same time such this arrangement minimizes damage to the die 16 and bond pads 24.

Referring now to FIGS. 3A–3F, process steps for forming an alternate embodiment test fixture 10A (FIG. 3F) are illustrated. In the alternate embodiment test fixture 10A the alignment member is formed as a deposited layer of material, preferably polyimide, that is deposited on the base 12A and then patterned (i.e., etched) with alignment openings 30A (FIG. 3F) using a layer of photoresist 36.

Figure 3A:
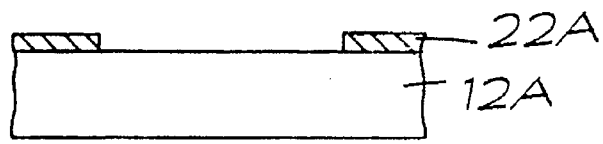
FIGS. 3A–3F are schematic views illustrating the steps involved in forming a test fixture having a deposited alignment layer.

With reference to FIG. 3A, the base 12A for the test fixture 10A is formed of a material as previously described having a coefficient of thermal expansion (CTE) which is similar to that of a silicon die. Initially, a metallization process is used to form the contact pads 22A. As before, the contact pads 22A connect to circuit traces and external contacts (not shown). These components function substantially as previously described and can be formed as previously described.

Figure 3B:

Next, as shown in FIG. 3B, a layer of polyimide 34 is blanket deposited over the base 12A. Polyimide films can be spun on in the form of a liquid using a polyamic-acid precursor. The spin on process is similar to the process used to deposit photoresist films. Using a spin on process the polyimide 34 can be deposited to a thickness of about 8 µm to 50 µm. Using multiple spin on steps, this thickness can be doubled (e.g., 50–100 µm). Following the spin on process, the layer of polyimide is soft cured by heating for a short time at a relatively low temperature (e.g., less than 150° C.) for several minutes.

Figure 3C:
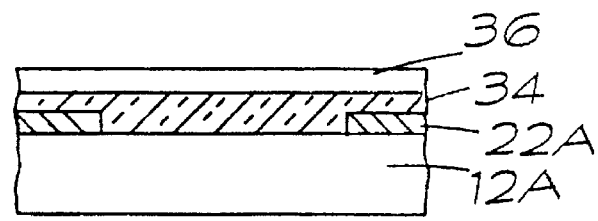

Next, as shown in FIG. 3C, a layer of photoresist 36 is deposited on the soft cured polyimide 34. The photoresist 36 can be deposited using a standard technique such as spin coating.

Figure 3D:
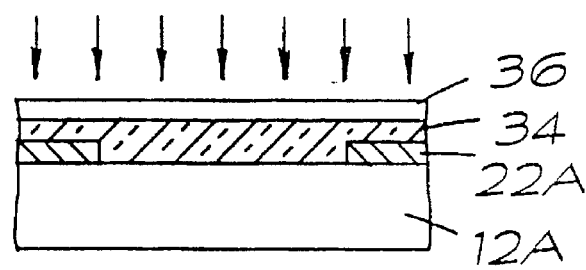

Next, as shown in FIG. 3D, the layer of photoresist 36 is exposed using a photomask and a UV source. For a positive tone resist, the photoresist 36 will be removed in a guide opening 30A (FIG. 3E) corresponding in size and peripheral shape to a semiconductor die 16. In addition, the guide opening 30A is precisely aligned to the contact pads 22A. A die 16 held in the guide opening 30A will thus be aligned for testing (i.e., bond pads 24 on die aligned with contact pads 22A).

Figure 3E:
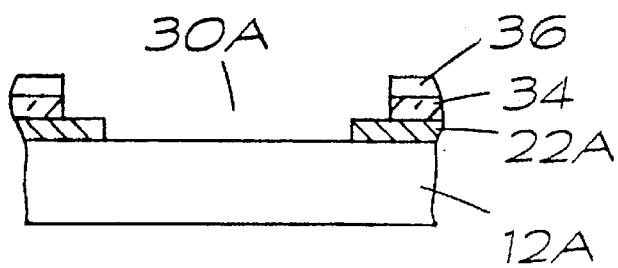

Next, as shown in FIG. 3E, the photoresist 36 and polyimide 34 are simultaneously developed to form the guide opening 30A. This can be done simultaneously because the same etchants that dissolve photoresist 36 also dissolve polyimide. As an example, both photoresist and polyimide can be developed using a 0.42N solution of tetramethylammonuim hydroxide (TMAH). In addition, such a wet development process will tend to etch the guide opening 30A with sloped sidewalls (e.g., 45° slope).

As with the prior embodiment, a wafer can be fabricated with a large number of test fixtures 10A to be singulated. Such a wafer can also include scribe lines or streets (not shown) for singulating the test fixture 10A. Preferably the photoresist 36 will be exposed to remove the polyimide 34 in the scribe lines. If singulation is by saw cutting, this will help prevent clogging of the saw blade.

Figure 3F:
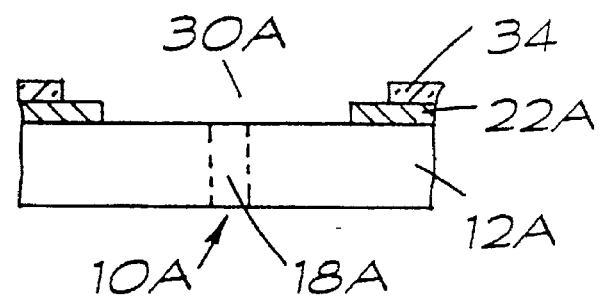

Next, as shown in FIG. 3F, the layer of photoresist 36 is stripped and the polyimide 34 is hard cured. During a high temperature cure step (e.g., 150° C. for 30 minutes and 300° C. for 60 minutes), the polyimide 34 undergoes a chemical change (imidization) that causes it to become a solid polyimide film.

As also shown in FIG. 3F, a vacuum hole 18A is formed in the base 12A. The vacuum hole 18A can be formed by depositing a mask on the backside of the base 12A and then etching the base 12A using a suitable wet or dry etchant.

The completed test fixture 10A functions substantially as previously described. In this case, the guide opening 30A formed in the polyimide 34 takes the place of the alignment opening 30 (FIG. 2) of alignment member 14 (FIG. 2) to provide alignment for the die 16. In addition, the polyimide seals around the outer periphery of the die 16 to form an enclosed cavity 32 (FIG. 2). Upon application of a vacuum through vacuum opening 18A, the bond pads 22 on the die 16 will be forced into engagement with the contact pads 22A on the base 12A substantially as previously described.

Thus the invention provides an improved test fixture and an improved method for forming a test fixture for testing unpackaged semiconductor die. Although preferred materials have been described, it is to be understood that other materials may also be utilized. Furthermore, although the invention has been described with reference to certain preferred embodiments, as will be apparent to those skilled in the art, certain changes and modifications can be made without departing from the scope of the invention as defined by the following claims.

What is claimed is:

1. A method for forming a test fixture for testing an unpackaged semiconductor die comprising:

forming a base;

forming a contact structure on the base configured to establish electrical communication between a contact location on the die and test circuitry;

forming an alignment layer on the base;

forming an alignment opening through the alignment layer to the base, said alignment opening configured to contact an outer periphery of the die to form a space between the die and base; and forming a vacuum opening on the base in flow communication with the space.

2. The method as claimed in claim 1 and further comprising applying a vacuum through the vacuum opening to the space to press the die against the base with the contact structure in electrical contact with the contact location.

3. The method as claimed in claim 1 and wherein the alignment layer comprises polyimide.

4. The method as claimed in claim 1 and wherein the contact structure comprises a pad formed by a metallization process.

5. The method as claimed in claim 1 and wherein the contact structure comprises a pad and the contact location comprises a bump.

6. The method as claimed in claim 1 and wherein a plurality of test fixtures are formed on a single wafer of base material and are then singulated.

7. The method as claimed in claim 1 and wherein a plurality of test fixtures are formed on a wafer having scribe lines for singulating the test fixtures.

8. The method as claimed in claim 1 and wherein the alignment layer comprises polyimide that is photopatterned and etched.

9. A method for forming a test fixture for testing an unpackaged semiconductor die, comprising:

forming a base;

forming a contact structure on the base, said contact structure configured to electrically contact a contact location on the die;

forming an electrical path between the contact structure and test circuitry;

forming an alignment member on the base comprising an alignment opening configured to form a sealed space between the die and base;

forming a vacuum opening on the base to the sealed space; and applying a vacuum through the vacuum opening to the sealed space to press the die against the base with the contact structure on the base in electrical contact with the contact location on the die.

10. The method as claimed in claim 9 and wherein the electrical path is formed by wire bonding or electrical clips.

11. The method as claimed in claim 9 and further comprising adjusting a pressure of the vacuum to control a force on the die.

12. The method as claimed in claim 9 and wherein the alignment member comprises a layer of polyimide deposited on the base.

13. The method as claimed in claim 12 and wherein the polyimide is deposited to a thickness of from 50 µm to 100 µm.

14. The method as claimed in claim 9 and wherein the contact structure comprises a pad formed by a metallization process.

15. A method for forming a test fixture for testing a semiconductor die, comprising:

forming an unpackaged base;

forming a contact structure on the base, configured to establish electrical communication between a bond pad on the die and test circuitry;

forming an alignment layer on the base with an alignment opening therein configured to seal around a periphery of the die to form a sealed space;

forming a vacuum opening through the base to the alignment opening; and applying a vacuum through the opening to the space to press the die against the base with the contact structure on the base in electrical contact with the bond pad on the die.

16. The method as claimed in 15 and further comprising adjusting a vacuum pressure of the vacuum to provide a desired contact force.

17. The method as claimed in claim 15 and further comprising adjusting a size of the vacuum opening to provide a desired contact force.

18. The method as claimed in claim 15 and further comprising forming a plurality of vacuum openings to provide a desired contact force.

19. The method as claimed in claim 15 and wherein the contact structure comprises a material selected from the group consisting of aluminum (Al), iridium (Ir), copper (Cu), titanium (Ti), tungsten (W), tantalum (Ta), molybdenum (Mo) and alloys of these metals.

20. The method as claimed in claim 15 and wherein the alignment layer comprises polyimide.

21. A test fixture for testing an unpackaged semiconductor die comprising:

a base having an opening thereon in flow communication with a vacuum source;

a contact structure formed on the base for establishing temporary electrical communication between a contact location on the die and test circuitry; and an alignment member formed on the base for aligning the contact structure and contact location, said alignment member comprising an alignment opening configured to contact an outer periphery of the die and form a sealed space in flow communication with the opening for applying a vacuum pressure to the die.

22. The test fixture as claimed in claim 21 and wherein the alignment member is formed separately and then attached to the base.

23. The test fixture as claimed in claim 21 and wherein the alignment member comprises a layer of a material deposited on the base.

24. The test fixture as claimed in claim 23 and wherein the material comprises polyimide.

25. The test fixture as claimed in claim 21 and wherein the contact location comprises a bump and the contact structure comprises a pad.

26. A method for testing an unpackaged semiconductor die comprising:

providing a base having an opening thereon in flow communication with a vacuum source;

providing a contact structure on the base in electrical communication with test circuitry and configured to establish temporary electrical communication with a contact location on the die;

providing an alignment member on the base comprising an alignment opening configured to contact an outer periphery of the die to form a space in flow communication with the opening;

aligning the die with the base using the alignment member; and applying a vacuum pressure through the opening to the space to press the die against the base with the contact structure and contact location in temporary electrical communication.

27. The method as claimed in claim 26 and further comprising applying test signals through the contact structure to the contact location.

28. The method as claimed in claim 26 and wherein the contact location comprises a solder bump.

29. The method as claimed in claim 26 and wherein the contact structure comprises a pad.

30. The method as claimed in claim 26 and further comprising adjusting the vacuum pressure.

* * * * *